United States Patent
McCluskey et al.

(10) Patent No.: US 10,995,624 B2
(45) Date of Patent: May 4, 2021

(54) ARTICLE FOR HIGH TEMPERATURE SERVICE

(71) Applicant: GENERAL ELECTRIC COMPANY, Schenectady, NY (US)

(72) Inventors: Patrick James McCluskey, Lee, NY (US); Bernard Patrick Bewlay, Niskayuna, NY (US); Ambarish Jayant Kulkarni, Glenville, NY (US); Krzysztof Jacek Lesnicki, Schenectady, NY (US); Byron Andrew Pritchard, Loveland, OH (US); Nicole Jessica Tibbetts, Delanson, NY (US)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 473 days.

(21) Appl. No.: 15/199,084

(22) Filed: Aug. 1, 2016

(65) Prior Publication Data
US 2018/0030839 A1    Feb. 1, 2018

(51) Int. Cl.
| | |
|---|---|
| *F01D 5/28* | (2006.01) |
| *F04D 29/02* | (2006.01) |
| *F04D 29/32* | (2006.01) |
| *F04D 29/54* | (2006.01) |
| *C23C 14/10* | (2006.01) |
| *C23C 14/06* | (2006.01) |

(Continued)

(52) U.S. Cl.
CPC .......... *F01D 5/288* (2013.01); *C23C 14/0694* (2013.01); *C23C 14/08* (2013.01); *C23C 14/081* (2013.01); *C23C 14/083* (2013.01); *C23C 14/10* (2013.01); *C23C 14/226* (2013.01); *C23C 14/30* (2013.01); *F04D 29/023* (2013.01); *F04D 29/324* (2013.01); *F04D 29/542* (2013.01); *F05D 2260/607* (2013.01); *Y02T 50/60* (2013.01); *Y10T 428/24355* (2015.01)

(58) Field of Classification Search
CPC ................ F01D 5/288; F05D 2230/90; F05D 2300/611; F05D 2300/6111
See application file for complete search history.

(56) References Cited

U.S. PATENT DOCUMENTS

| | | | |
|---|---|---|---|
| 4,021,529 A | 5/1977 | Kuriakose | |
| 5,562,998 A * | 10/1996 | Strangman | C23C 4/18 428/612 |

(Continued)

FOREIGN PATENT DOCUMENTS

| | | | | |
|---|---|---|---|---|
| DE | 102014215082 A1 * | 2/2016 | | F01D 5/28 |
| EP | 2471975 A1 | 7/2012 | | |
| EP | 2626447 A1 | 8/2013 | | |

OTHER PUBLICATIONS

The Long and Short of Last-stage Blades from PowerMag, Dec. 15, 2006, retrieved on Apr. 1, 2017.*

(Continued)

*Primary Examiner* — Z. Jim Yang
(74) *Attorney, Agent, or Firm* — Dority & Manning, P.A.

(57) ABSTRACT

An article includes a substrate that is substantially opaque to visible light and a coating disposed on the substrate. The coating includes a coating material having an inherent index of refraction, wherein the coating has an effective index of refraction that is less than the inherent index of refraction, and wherein the effective index of refraction is less than 1.8.

21 Claims, 1 Drawing Sheet

Figure 1:
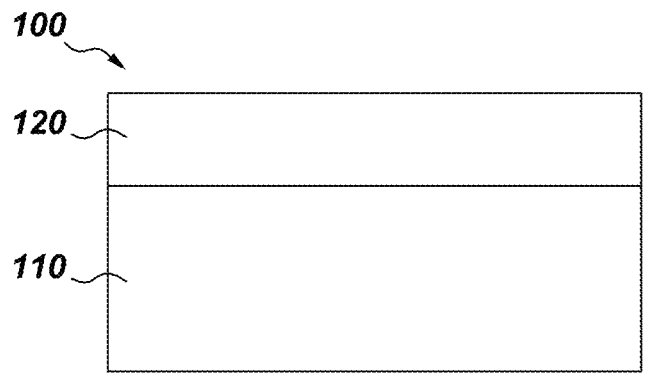

(51) Int. Cl.
*C23C 14/08* (2006.01)
*C23C 14/30* (2006.01)
*C23C 14/22* (2006.01)

(56) References Cited

U.S. PATENT DOCUMENTS

| | | | |
|---|---|---|---|
| 5,942,557 A | 8/1999 | Ooms et al. | |
| 6,015,630 A * | 1/2000 | Padture | F01D 5/288 428/632 |
| 6,294,260 B1 * | 9/2001 | Subramanian | C23C 28/3455 428/469 |
| 6,296,447 B1 | 10/2001 | Rigney et al. | |
| 6,465,090 B1 | 10/2002 | Stowell et al. | |
| 6,495,271 B1 * | 12/2002 | Vakil | C23C 28/00 428/632 |
| 6,582,834 B2 | 6/2003 | Nagaraj et al. | |
| 6,703,137 B2 * | 3/2004 | Subramanian | C23C 4/18 416/241 B |
| 6,756,082 B1 * | 6/2004 | Subramanian | C23C 14/083 427/454 |
| 7,465,681 B2 * | 12/2008 | Hart | G02B 1/10 438/788 |
| 8,496,992 B2 | 7/2013 | Wei et al. | |
| 2003/0029563 A1 * | 2/2003 | Kaushal | C23C 16/4404 156/345.1 |
| 2005/0013994 A1 * | 1/2005 | Strangman | C23C 28/36 428/336 |
| 2005/0266163 A1 * | 12/2005 | Wortman | C23C 28/34 427/248.1 |
| 2006/0016191 A1 * | 1/2006 | Woodcock | C23C 4/18 60/754 |
| 2006/0024508 A1 * | 2/2006 | D'Urso | B08B 17/06 428/426 |
| 2006/0172544 A1 * | 8/2006 | Inaki | H01L 21/67069 438/710 |
| 2007/0028588 A1 * | 2/2007 | Varanasi | F28F 13/187 60/39.5 |
| 2008/0008839 A1 * | 1/2008 | Lee | C23C 28/42 427/402 |
| 2009/0017260 A1 * | 1/2009 | Kulkarni | C23C 28/36 428/161 |
| 2009/0169914 A1 * | 7/2009 | Fu | C23C 28/321 428/610 |
| 2009/0280298 A1 * | 11/2009 | Rosenzweig | C23C 30/00 428/156 |
| 2010/0028128 A1 * | 2/2010 | Fischer | F01D 25/12 415/1 |
| 2010/0039708 A1 * | 2/2010 | Suzuki | G02B 1/11 359/601 |
| 2010/0068507 A1 * | 3/2010 | Strangman | C23C 28/3455 428/332 |
| 2010/0247321 A1 * | 9/2010 | Kulkarni | C23C 4/08 416/223 R |
| 2010/0259823 A1 | 10/2010 | Xi et al. | |
| 2011/0003119 A1 * | 1/2011 | Doesburg | C23C 4/11 428/155 |
| 2011/0014060 A1 * | 1/2011 | Bolcavage | F01D 5/20 416/241 R |
| 2011/0151239 A1 * | 6/2011 | Lane | C04B 35/632 428/312.8 |
| 2011/0236657 A1 * | 9/2011 | Feist | C23C 28/3455 428/213 |
| 2012/0094029 A1 * | 4/2012 | Halberstadt | F01D 5/288 427/446 |
| 2012/0231211 A1 * | 9/2012 | von Niessen | C23C 4/134 428/119 |
| 2012/0276352 A1 * | 11/2012 | Liu | C04B 35/486 428/215 |
| 2013/0129978 A1 * | 5/2013 | Varanasi | C23C 4/123 428/141 |
| 2013/0236322 A1 * | 9/2013 | Schmidt | B32B 7/02 416/224 |
| 2014/0154441 A1 | 6/2014 | Pranov | |
| 2014/0272435 A1 | 9/2014 | Dershem | |
| 2015/0118443 A1 * | 4/2015 | Lipkin | C04B 41/009 428/163 |
| 2015/0175814 A1 | 6/2015 | Aizenberg et al. | |
| 2016/0369636 A1 * | 12/2016 | Hitchman | F01D 5/18 |

OTHER PUBLICATIONS

NPL on Siemens SGT-400, obtained from http://www.energy.siemens.com/mx/pool/hq/power-generation/gas-turbines/SGT-400/Brochure%20Gas%20Turbine%SGT-400%20for%20Power%20Generation.pdf, 2009, retrieved on Apr. 2, 2017.*

R.H. French et al., "Full spectral calculation of non-retarded Hamaker constants for ceramic systems from interband transition strengths," Solid State Ionics 75, 1995, pp. 13-33.

J.Q. Xi et al., Low-Refractive-Index Films: A New Class of Optical Materials, IEEE LEOS Newsletter, Dec. 2005, pp. 10-12.

G. L Tan et al., "Optical properties and London dispersion interaction of amorphous and crystalline SiO2 determined by vacuum ultraviolet spectroscopy and spectroscopic ellipsometry", 2005.

Schubert et al., "Distributed Bragg reflector consisting of high- and low-refractive-index thin film layers made of the same material", Apr. 6, 2007.

Schubert et al., "Low-refractive-index materials: A new class of optical thin-film materials", Jun. 18, 2007.

Paolo F. et al., "Hierarchical Porous Silica Films with Ultralow Refractive Index", p. 2055-2061, Apr. 27, 2009.

Kakiuchi et al., "Low refractive index silicon oxide coatings at room temperature using atmospheric pressure very high frequency plasma", Journal of Thin Solid Films, vol. 519, p. 235-239, Oct. 29, 2010.

PCT Search Report and Written Opinion issued in connection with corresponding WO application No. PCT/US2017/042029 dated Oct. 13, 2017.

* cited by examiner

ARTICLE FOR HIGH TEMPERATURE SERVICE

BACKGROUND OF THE INVENTION

The invention generally relates to protective coatings for components exposed to high temperatures within a chemically and thermally hostile environment. More particularly, this invention is relates to an anti-stick coating for components, e.g., gas turbine engine components, so as to inhibit the accumulation of deposits of adherent contaminants typically entrained in the flow of air through the components during service.

The operating environment within a gas turbine engine is well known to be both thermally and chemically hostile. The accumulation of sand, ash, sea salt, and other particulate foreign matter (herein referred to collectively as "dust") on the external and internal surfaces of metal components, such as compressor blades and vanes, exacerbates the problem posed by the aggressive operating environment. Accumulated dust on the walls of internal cooling passages (referred to herein as "internal surfaces") creates a thermally insulating layer that inhibits cooling of the component, thereby increasing the temperature at which the component is forced to operate. Externally accumulated dust can also degrade thermal performance of components; moreover, the adherent layer of dust may contribute chemical species that participate in subsequent corrosion reactions with the metal surface. Typically, dust is ingested along with air at intake ports and becomes entrained with the flow of gases through the engine. As the dust particles impinge upon the internal and external surfaces of components along the flow path, they may stick to the surface to create an undesirable layer of foreign matter on the component. This accumulation, and its associated degradation in component performance, leads to increased frequency of servicing, such as to remove accumulated dust or to refurbish or replace damaged components.

In view of the above, there is a need for improved coating systems that provide protection against dust accumulation in high temperature machine components.

BRIEF DESCRIPTION OF THE INVENTION

Embodiments of the present invention address this and other needs. One embodiment is an article, comprising a substrate that is substantially opaque to visible light and a coating disposed on the substrate. The coating comprises a coating material having an inherent index of refraction, wherein the coating has an effective index of refraction that is less than the inherent index of refraction, and wherein the effective index of refraction is less than 1.8.

Another embodiment is an article comprising a substrate. The substrate comprises a titanium alloy, a superalloy, or a ceramic-matrix composite. A coating is disposed on the substrate. The coating comprises (a) a fluoride of one or more alkaline earth elements, (b) alumina, silica, zirconia, or chromia, or (c) a combination including any one or more of the foregoing alternatives. The coating further comprises a plurality of columnar structures oriented such that a longitudinal axis of a columnar structure forms an angle with respect to a direction tangential to the substrate that is less than 60 degrees.

DRAWINGS

Figure 2:
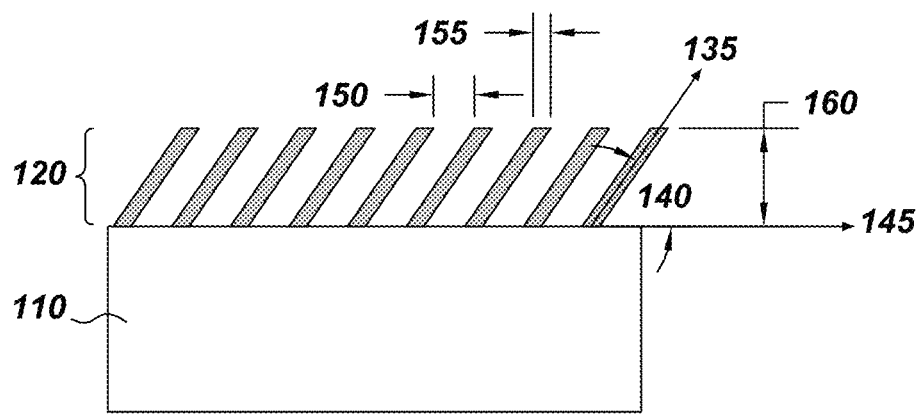

These and other features, aspects, and advantages of the present invention will become better understood when the following detailed description is read with reference to the accompanying drawings, in which like characters represent like parts throughout the drawings, wherein:

FIG. 1 provides a cross-sectional view of one embodiment of the present invention; and FIG. 2 provides a cross-sectional view of certain details for an illustrative embodiment of the present invention.

DETAILED DESCRIPTION

Approximating language, as used herein throughout the specification and claims, may be applied to modify any quantitative representation that could permissibly vary without resulting in a change in the basic function to which it is related. Accordingly, a value modified by a term or terms, such as "about", and "substantially" is not to be limited to the precise value specified. In some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise.

In the following specification and the claims, the singular forms "a", "an" and "the" include plural referents unless the context clearly dictates otherwise. As used herein, the term "or" is not meant to be exclusive and refers to at least one of the referenced components being present and includes instances in which a combination of the referenced components may be present, unless the context clearly dictates otherwise.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances, the modified term may sometimes not be appropriate, capable, or suitable.

As used herein, the term "coating" refers to a material disposed on at least a portion of an underlying surface in a continuous or discontinuous manner. Further, the term "coating" does not necessarily mean a uniform thickness of the disposed material, and the disposed material may have a uniform or a variable thickness. The term "coating" may refer to a single layer of the coating material or may refer to a plurality of layers of the coating material. The coating material may be the same or different in the plurality of layers.

As used herein, the term "disposed on" refers to layers or coatings disposed directly in contact with each other or indirectly by having intervening layers there between, unless otherwise specifically indicated. The term "adjacent" as used herein means that the two layers or coatings are disposed contiguously and are in direct contact with each other.

Embodiments of the present invention are generally applicable to components that are subjected to airborne contaminants, such as those present in the inlet air of a gas turbine engine. The invention is particularly directed to reducing the adhesion of such compounds and contaminants, which if not inhibited would lead to a buildup of dirt deposits that tenaciously adhere to the surfaces of the component. Notable examples of such components include the blades and vanes of compressors and other components used in gas turbine engines. While the advantages of these embodiments will be described with reference to such components, the principles and techniques described herein are believed to be generally applicable to other machine components whose surfaces are susceptible to being coated with an adherent layer of contaminants, and need not be limited to turbine components.

Conceptually, embodiments of the present invention include the application of a coating having comparatively low index of refraction (referred to herein as "low-n") to reduce adhesion between dust particles and machine components. Although the connection between an optical property of a coating (index of refraction, signified as n) to its dust-adhesion properties may, at first consideration, seem rather attenuated, the present inventors have applied a physics-based approach to material interactions to derive a model of how dust particles may interact with a solid surface, and have discerned index of refraction as a significant predictor of the adhesion forces between a component's surface and a dust particle, with such forces decreasing as the index of refraction of the component surface decreases. The application of this discovery resulted in the embodiments described herein.

While understanding of the adhesion mechanisms between dust particles and machine components is limited, current theories on interaction energies between two materials do exist. Theoretically, the magnitude of interaction energy between two materials is quantified by the Hamaker constant, the magnitude of which is largely dependent on the dielectric response functions of materials involved in the interaction. The dielectric response function is in turn influenced by the index of refraction in the visible spectrum, as described, for example, in R. H. French, et al., *Solid State Ionics*, 75 (1993), pp. 13-33. Application of these principles to the problem at hand suggests that for a given dust particle material, a surface having a lower index of refraction than a reference surface will have a lower interaction energy with the dust particle than will the reference surface. Assuming that these interaction energies play a significant role in developing the adhesion forces, i.e. van der Waals forces, generated between dust particles and machine component surfaces, then, resulted in a hypothesis that the application of a low-n material to a surface will reduce the attractive force between the surface and dust particles, thereby reducing the propensity of the dust to adhere to and accumulate on the surface.

Experimental results supported this hypothesis. For example, in one experiment, the probe retraction force in an atomic force microscope was measured for various surfaces having respectively different values of n. The retraction force, a measure of the attractive force between the microscope's probe and the surface, was found to be significantly affected by index of refraction of the surface; indeed the measured retraction force was reduced by a factor of approximately six when the index of refraction was reduced from about 2.7 (for a bare nickel alloy surface) to about 1.3 (for a ceramic coating material).

Embodiments of the present invention are designed to take advantage of these remarkable results. Referring to FIG. 1, an article 100 in accordance with one embodiment includes a substrate 110 and a coating 120 disposed on substrate 110. It should be appreciated that coating 120 may be applied directly in contact with substrate 110 or with intervening coating layers (not shown) such as thermal barrier coatings, environmental barrier coatings, oxidation resistant coatings, or other coatings, disposed between substrate 110 and coating 120. Generally, article 100 can be any surface that would benefit from reduced accumulation of dust and other airborne debris. Windows, sensors, solar panels and solar collectors, aircraft, spacecraft, automobiles, displays, and the mechanical works of machinery are a few of the wide-ranging applications for dust-resistant surfaces such as may be imparted by coating 120. Article 100 may be, for instance, a component for a turbine assembly, such as a compressor blade or compressor vane. Such components may include internal passages designed to carry a cooling fluid, typically air; it will be appreciated that coating 120 may be disposed on a surface of an internal passage (an "internal surface") or an external surface (that is, any surface on the exterior) of the component, and thus substrate 110 as depicted in FIG. 1 may be an internal surface or an external surface of article 100. Of course, coating 120 may be disposed on both external and internal surfaces of article 100 in any combination. Substrate 110 may include any useful material, such as a glass, a plastic, a metallic material, a ceramic material, or an intermetallic material. Particular examples of materials used in gas turbine assembly components include titanium alloys, superalloys (such as nickel-based superalloys and cobalt-based superalloys) and ceramic-matrix composites (such as composites bearing a silicon carbide matrix reinforced with silicon carbide fibers).

In certain embodiments, substrate 110 is opaque to visible light, which is in stark contrast to many other known applications of low-n coatings in various industries. Typically, such coatings are applied to transparent substrates in applications such as photonics where the coatings provide enhanced surface functionality with minimal distortion of incident light. In embodiments of the present invention, coating 120 is not applied for its resultant interaction with incident radiation during service, but instead for its interaction with incident dust.

Coating 120 includes a coating material that has an inherent index of refraction. As used herein, "inherent index of refraction" refers to the index of refraction measured for a quantity of the material at a given frequency of incident light, where the material is at substantially full theoretical density. This is the index of refraction that is commonly reported in the material property reference literature. However, coating 120 has an effective index of refraction that is less than the inherent index of refraction. As used herein, the "effective index of refraction" is the index of refraction that is measured for the coating in its entirety, which may be different from the inherent index of refraction of its constituent material due to structural features included in the coating that are typically not present in theoretically dense materials. These structural features cause the coating to behave optically somewhat differently than would be predicted solely by knowledge of the optical properties of the constituent material. Based on the relationship described above between n and the expected attractive force between materials, the effective index of refraction is designed to have a comparatively low value, such as a value below about 1.8. In certain embodiments, the effective index of refraction is below about 1.6, and in particular embodiments this index value is below about 1.4.

As noted above, structural features are incorporated into coating 120 to reduce its effective index of refraction. In one example, the structural features include porosity incorporated into the coating 120. Additionally or alternatively, incorporating microcracks, bumps, ribs, or other discontinuities within the coating structure effectively reduces the density of the coating from its theoretical density value. The incorporation of porosity or other discontinuity creates in effect a composite coating comprising the constituent material and the air (n~1), or other gas, or, in some cases, vacuum, entrained within the structure. In one embodiment, coating 120 has a porosity (that is, a measure of the void fraction in the coating, whether due to pores or other discontinuity) of at least about 10 percent by volume, and in particular embodiments the porosity is at least about 40 percent by volume. Of course, in some embodiments an unduly high porosity level would set the durability of the coating below what is required for a desired application; accordingly, in such embodiments the porosity is up to about 60 percent by volume.

Other effective structural features are possible. For instance, in one embodiment, as illustrated in FIG. 2, coating 120 includes a plurality of columnar structures 130 (also referred to herein as "columns"). These structures 130 are oriented such that a longitudinal axis 135 of a columnar structure 130 forms an angle 140 with respect to a direction 145 tangential to substrate 110 that is less than 90 degrees. The inventors found that a smaller angle 140 tends to produce a lower index of refraction for a given material. In some embodiments, angle 140 is less than about 80 degrees, and in particular embodiments the angle 140 is less than about 60 degrees. As shown in FIG. 2, the columns are substantially parallel, but it will be appreciated that this need not be the case; in some embodiments at least some of the structures 130 are oriented at respectively different angles 140 than other structures, and in certain embodiments the individual structures have a random angular orientation with respect to the substrate tangent 145.

Other aspects of columnar features 130 may affect the effective index of refraction of coating 120. One aspect is the spacing 150 between columns, referred to herein as "intercolumnar spacing." The mean spacing between the plurality of columns 130 is referred to herein as "nominal intercolumnar spacing," and in some embodiments is less than about 5 micrometer. The effective index of refraction is expected to decrease as the nominal intercolumnar spacing decreases, thus in certain embodiments the nominal intercolumnar spacing is less than about 2 micrometers, and in particular embodiments is less than about 0.5 micrometers. Another aspect that may influence the effective index of refraction of coating 120 is the width 155 of the columns 130. The mean width of the plurality of columns 130 is referred to herein as the "nominal column width," and in some embodiments is less than about 1 micrometer. The width 155 is shown in an idealized fashion in FIG. 2; where columns 130 have irregular shapes, width 155 may be represented by a cylindrical equivalent diameter approximation using techniques common in the art. The effective index of refraction is expected to decrease as the nominal column width decreases, thus in certain embodiments the nominal column width is less than about 0.25 micrometer.

Coating 120 typically comprises a material having comparatively low inherent index of refraction, such as an oxide or a fluoride, though other suitable materials may be applied. Examples of oxides include alumina, silica, zirconia, chromia, or any combination that includes one or more of these. Examples of fluorides include fluorides of one or more alkaline earth elements, such as magnesium, calcium, strontium, and/or barium.

The presence of columnar structures 130 and/or porosity in coating 120 also provides coating 120 with a measure of compliance, that is, the ability to accommodate a quantity of strain without spalling or cracking. These structures can be said to afford the coating a stiffness value (typically represented by the ratio of force to displacement produced by the force) that is lower than a stiffness value that would be measured for coating material of theoretical density ("inherent stiffness value"). Another similar indicator of coating compliance is its effective modulus, typically measured by obtaining a stress-strain plot for the coating material and calculating the slope of the linear portion of the plot. Enhancing the compliance (that is, lowering the stiffness or modulus) of coating 120 may be desirable for producing durable coatings in applications such as turbine engine assemblies, where components generally are routinely exposed to thermal cycling. Coating thickness 160 may also play a role in the durability of the coating, in that thinner coatings often are more durable than thicker coatings. Additionally, thick coatings may inhibit cooling of components such as compressor components relative to thinner coatings. In some embodiments, coating 120 has a thickness 160 less than 100 micrometers, while in certain embodiments the thickness 160 is less than 25 micrometers, and in particular embodiments thickness 160 is less than 10 micrometers.

As an example of an embodiment that combines several of the points noted above, an article 100 includes a substrate 110 comprising a titanium alloy, a superalloy, or a ceramic-matrix composite, and a coating 120 disposed on substrate 110. Coating 120 comprises (a) a fluoride of one or more alkaline earth elements, (b) alumina, silica, zirconia, or chromia, or (c) a combination including any one or more of the foregoing alternatives. Moreover, coating 120 further comprises a plurality of columnar structures 130 oriented such that a longitudinal axis 135 of a columnar structure 130 forms an angle 140 with respect to a direction 145 tangential to substrate 110 that is less than 60 degrees.

Any of various manufacturing methods may be used to fabricate article 100. For example, physical vapor deposition methods such as sputtering or evaporation may be used to apply coating 120 to substrate 110. Columnar structures 130 may be deposited, for example, using electron-beam assisted physical vapor deposition (EB-PVD), and in such cases angle 140 may be generated by controlling the angle of deposition during the EB-PVD process. One example of such a process is glancing angle deposition ("GLAD") in which a source of coating material is oriented at a predefined, substantial angle relative to the substrate surface, resulting in angled columnar structures in the deposit. Other methods of coating deposition, such as chemical vapor deposition, thermal spraying, plasma spraying, spin coating, and other techniques known in the art may be applied for deposition of coating 120 as well.

EXAMPLES

The following examples are presented to further illustrate embodiments of the present invention, and should not be considered as limiting the scope of the invention.

In the following examples, a dust accumulation test was used to compare a baseline control specimen to a specimen structured in accordance with the various techniques described herein. The specimens had coatings applied to a base substrate representative of a metal engine component. Airflow containing a controlled amount of entrained dust was directed at the specimen through stainless steel tubing at an angle of 45 degrees with respect to the specimen surface. The dust accumulation test was performed for a constant dust feed duration. The deposited volume was quantified using a scan of the surface with chromatic white light profilometry. This technique captured the resulting topography. Accumulated dust was segmented from the specimen surface and volume above specimen surface was totaled for comparison with other specimens.

Example 1

A test specimen was coated with a commercially available high-temperature colloidal silica coating applied by aerosol spraying in two passes about 5 inches above the substrate surface. The coated specimen (n~1.5) and a control specimen (Alloy 718, uncoated, n~2.8) were tested as described above at room temperature for 7.5 minutes of dust exposure. The coated specimen accumulated less than 40% by volume of dust relative to the amount accumulated by the control.

Example 2

A test specimen was coated by GLAD with alumina, at a deposition angle of 80 degrees relative to the substrate normal, which resulted in a coating having columnar features oriented at an angle of less than 60 degrees relative to the substrate tangent (n~1.3). The coated specimen and a control specimen (Alloy 718, uncoated, n~2.8) were tested as described above at room temperature for 2.5 minutes of dust exposure. The coated specimen accumulated about 10% by volume of dust relative to the amount of dust accumulated by the control.

Example 3

Three different coating materials deposited by EB-PVD (chromia; zirconia with 20 percent yttria by weight ("20YSZ"); and zirconia with 8 percent yttria by weight ("8YSZ")), were investigated at two different deposition angles (0 degrees and 80 degrees relative to substrate normal). All specimens were tested using the dust exposure test described above. Significant reductions in the amount of dust accumulated were observed for the coatings deposited at 80 degrees relative to the coatings deposited at 0 degrees. The chromia and the 8YSZ specimens showed a reduction of between 10% and 20% accumulation for the 80 degree deposited coatings, while the 20 YSZ coating deposited at 80 degrees showed greater than 40% reduction relative to its counterpart deposited at 0 degrees.

The present invention has been described in terms of some specific embodiments. They are intended for illustration only, and should not be construed as being limiting in any way. Thus, it should be understood that modifications can be made thereto, which are within the scope of the invention and the appended claims. Furthermore, all of the patents, patent applications, articles, and texts which are mentioned above are incorporated herein by reference.

The invention claimed is:

1. An article, comprising:
a substrate that is substantially opaque to visible light; and
a coating disposed on the substrate, wherein the coating comprises a coating material having an inherent index of refraction, wherein the coating has an effective index of refraction that is less than the inherent index of refraction, and wherein the coating comprises a plurality of columnar structures oriented such that a longitudinal axis of each of the plurality of columnar structures form an angle with respect to a direction tangential to the substrate that is less than 90 degrees, and wherein each of the plurality of columnar structures have a nominal width of less than 2.5 micrometers, and wherein each of the plurality of columnar structures have a nominal intercolumnar spacing of less than 5 micrometers such that the effective index of refraction of the coating is less than 1.8.

2. The article of claim 1, wherein the substrate comprises a metallic material, a ceramic material, or an intermetallic material.

3. The article of claim 1, wherein the substrate comprises a titanium alloy, a superalloy, or a ceramic-matrix composite.

4. The article of claim 1, wherein the article comprises a component for a turbine assembly.

5. The article of claim 4, wherein the component is a compressor blade or compressor vane.

6. The article of claim 1, wherein the angle is less than 80 degrees.

7. The article of claim 1, wherein the angle is less than 60 degrees.

8. The article of claim 1, wherein the nominal intercolumnar spacing is less than about 2 micrometers.

9. The article of claim 1, wherein the nominal intercolumnar spacing is less than about 0.5 micrometer.

10. The article of claim 1, wherein the nominal column width is less than about 1 micrometer.

11. The article of claim 1, wherein the nominal column width is less than about 0.25 micrometer.

12. The article of claim 1, wherein the coating has a coating stiffness value that is less than an inherent stiffness value of the coating material.

13. The article of claim 1, wherein the coating material comprises an oxide or a fluoride.

14. The article of claim 1, wherein the coating material comprises alumina, silica, zirconia, chromia, or a combination including one or more of these.

15. The article of claim 1, wherein the coating has a thickness of less than 100 micrometers.

16. The article of claim 1, wherein the coating has a thickness of less than 25 micrometers.

17. The article of claim 1, wherein the coating has a thickness of less than 10 micrometers.

18. The article of claim 1, wherein the substrate comprises an internal surface of the article.

19. The article of claim 1, further comprising at least one intervening coating layer disposed between the substrate and the coating.

20. The article of claim 1, wherein the coating has a porosity of at least about 40 percent by volume.

21. An article comprising:
a substrate comprising a titanium alloy, a superalloy, or a ceramic-matrix composite; and
a coating disposed on the substrate, the coating comprising (a) a fluoride of one or more alkaline earth elements, (b) alumina, silica, zirconia, or chromia, or (c) a combination including any one or more of the foregoing alternatives;
wherein the coating further comprises a plurality of columnar structures oriented such that a longitudinal axis of a columnar structure forms an angle with respect to a direction tangential to the substrate that is less than 60 degrees, and wherein each of the plurality of columnar structures have a nominal width of less than 2.5 micrometers, and wherein each of the plurality of columnar structures have a nominal intercolumnar spacing of less than 5 micrometers such that the effective index of refraction of the coating is less than 1.8.

* * * * *